United States Patent
Liu et al.

(10) Patent No.: US 9,508,776 B2
(45) Date of Patent: Nov. 29, 2016

(54) GATING DEVICE CELL FOR CROSS ARRAY OF BIPOLAR RESISTIVE MEMORY CELLS

(71) Applicant: INSTITUTE OF MICROELECTRONICS, CHINESE ACADEMY OF SCIENCES, Beijing (CN)

(72) Inventors: Qi Liu, Beijing (CN); Ming Liu, Beijing (CN); Shibing Long, Beijing (CN); Hangbing Lv, Beijing (CN); Yan Wang, Beijing (CN)

(73) Assignee: Insitute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/771,145

(22) PCT Filed: Sep. 24, 2013

(86) PCT No.: PCT/CN2013/084063
§ 371 (c)(1),
(2) Date: Aug. 27, 2015

(87) PCT Pub. No.: WO2014/139277
PCT Pub. Date: Sep. 18, 2014

(65) Prior Publication Data
US 2016/0013246 A1    Jan. 14, 2016

(30) Foreign Application Priority Data

Mar. 15, 2013 (CN) .......................... 2013 1 0084292

(51) Int. Cl.
*H01L 27/24* (2006.01)
*G11C 13/00* (2006.01)
*H01L 45/00* (2006.01)

(52) U.S. Cl.
CPC ......... *H01L 27/2463* (2013.01); *G11C 13/004* (2013.01); *G11C 13/0007* (2013.01);
(Continued)

(58) Field of Classification Search
CPC .................................................. H01L 27/2463
See application file for complete search history.

(56) References Cited

U.S. PATENT DOCUMENTS 4,016,593 A * 4/1977 Konishi ............... H01L 31/1113
                                                                   250/227.32
4,709,253 A * 11/1987 Walters ................... H01L 24/33
                                                                   257/603

(Continued)

FOREIGN PATENT DOCUMENTS

CN         1319273 A      10/2001
CN      201478303 U       5/2010
(Continued)

*Primary Examiner* — Eugene Lee
(74) *Attorney, Agent, or Firm* — Christensen Fonder P.A.

(57) ABSTRACT

A gating device cell for a cross array of bipolar resistive memory cells comprises an n-p diode and a p-n diode, wherein the n-p diode and the p-n diode have opposite polarities and are connected in parallel, such that the gating device cell exhibits a bidirectional rectification feature. The gating device cell exhibits the bidirectional rectification feature, that is, it can provide a relatively high current density at any voltage polarity in its ON state, and also a relatively great rectification ratio ($R_{V/2}/R_V$) under a read voltage. Therefore, it is possible to suppress read crosstalk in the cross array of bipolar resistive memory cells to avoid misreading, thereby solving the problem that a conventional rectifier diode is only applicable to a cross array of unipolar resistive memory cells.

17 Claims, 4 Drawing Sheets

(52) U.S. Cl.
CPC ....... *G11C13/0023* (2013.01); *G11C 13/0069* (2013.01); *H01L 27/2409* (2013.01); *H01L 45/04* (2013.01); *H01L 45/08* (2013.01); *H01L 45/124* (2013.01); *H01L 45/1253* (2013.01); *H01L 45/146* (2013.01); *H01L 45/148* (2013.01); *G11C 13/003* (2013.01); *G11C 2013/0054* (2013.01); *G11C 2013/0073* (2013.01); *G11C 2213/15* (2013.01)

(56) References Cited

U.S. PATENT DOCUMENTS

| | | | |
|---|---|---|---|
| 5,583,075 A * | 12/1996 | Ohzu | H01L 27/0928 257/E21.538 |
| 6,075,277 A * | 6/2000 | Pezzani | H01L 21/761 257/499 |
| 6,437,626 B1 | 8/2002 | Ohtsubo | |
| 6,919,625 B2 * | 7/2005 | O'Shea | H01L 23/49524 174/537 |
| 7,052,941 B2 * | 5/2006 | Lee | B82Y 10/00 257/E27.026 |
| 2005/0274956 A1 | 12/2005 | Bhat | |
| 2007/0080355 A1 * | 4/2007 | Lin | H01L 25/0753 257/81 |
| 2009/0140233 A1 * | 6/2009 | Kinoshita | G11C 5/02 257/4 |
| 2011/0007546 A1 | 1/2011 | Amin et al. | |
| 2012/0061639 A1 | 3/2012 | Yasuda | |
| 2015/0060895 A1 | 3/2015 | Zeng et al. | |

FOREIGN PATENT DOCUMENTS

| | | |
|---|---|---|
| CN | 102637681 A | 8/2012 |
| CN | 103137646 A | 6/2013 |

* cited by examiner

GATING DEVICE CELL FOR CROSS ARRAY OF BIPOLAR RESISTIVE MEMORY CELLS

CROSS-REFERENCE TO RELATED APPLICATION(S)

This application is a U.S. national phase application of PCT Application No. PCT/CN2013/084063 filed on Mar. 15, 2013, entitled "GATE DEVICE UNIT FOR CROSS ARRAY INTEGRATION MODE OF BIPOLAR RESISTIVE RANDOM ACCESS MEMORY," which claims priority to Chinese Application No. 201310084292.7 filed on Mar. 15, 2013. Both the PCT Application and the Chinese Application are incorporated herein by reference in their entireties.

TECHNICAL FIELD

The present disclosure relates to the microelectronic technology, and in particular, to a gating device cell for a cross array of bipolar resistive memory cells.

BACKGROUND

As an emerging non-volatile memory technology, Resistive Random Access Memories (RRAMs) have great advantages in many aspects, such as, device structure, cell area, storage density, power consumption, programming/erasing speed, 3D integration and multi-value storage, and are becoming one of the most powerful competitors in replacing "flash" memories which are currently mainstream products in the non-volatile memory market. A sandwich structure of Metal/Insulator/Metal (MIM) is a basic structure for the resistive memory, and such a vertical MIM structure is beneficial for cross-array integration to achieve super high density storage. In a cross-array structure, cross points between upper and lower lines which are perpendicular to each other contain memory cells, each of which can achieve gating and reading/writing.

However, the existing resistive memory cell has a symmetric read current-voltage curve under positive and negative voltage polarities. As shown in FIG. 1, when the resistor memory cell is in a low resistance state and a range of $-V_{read} \rightarrow V_{read}$ is Direct Current (DC) scanned, this device presents a symmetric current-voltage curve under positive and negative voltage polarities. When a cross-array memory architecture is used, a memory cell in the low resistance state will provide an additional leakage path due to the symmetric read electrical characteristic of the memory cell. Such a leakage path will impact information read from a gated memory cell and cause a serious read crosstalk problem in the cross array. As shown in FIG. 2, among four neighboring memory cells, a cell at coordinates (1, 1) is in a high resistance state, and the other three cells (1, 2), (2, 2), and (2, 1) are all in a low resistance state. When a read voltage is applied to the device (1, 1), the current may flow along the low resistance path (1, 2)→(2, 2)→(2, 1) (shown by the dashed line), such that the device (1, 1) is misread as an ON state (or a low resistance state).

In the prior art, the misreading phenomenon may be effectively addressed by connecting a rectifier diode to the resistive memory cell in series. However, because the rectifier diode generally shows an ON feature only in the forward direction but cannot provide enough current in the reverse direction, the resistive memory cell that currently can be integrated with the rectifier diode must have a unipolar resistance switching feature. That is, programming and erasing operations for the resistive memory cell must be done in the same voltage polarity. For a more popular bipolar resistive memory cell, its programming and erasing operations must be done in opposite voltage polarities, and therefore a single rectifier diode cannot meet the current requirement for its erasing in the reverse direction. As a result, the misreading phenomenon caused by the read crosstalk in a cross array of bipolar resistive memory cells cannot be effectively addressed up to now.

SUMMARY

Technical Problem To Be Solved

In view of the above, an object of the present disclosure is to provide a gating device cell that is applicable to a cross array of bipolar resistive memory cells, so as to suppress the misreading phenomenon caused by the read crosstalk in the cross array of bipolar resistive memory cells.

Technical Solutions

To achieve the above object, the present disclosure provides a gating device cell for a cross array of bipolar resistive memory cells. The gating device cell comprises an n-p diode and a p-n diode. The n-p diode and the p-n diode have opposite polarities and are connected in parallel, such that this gating device cell exhibits a bidirectional rectification feature.

According to an embodiment, the n-p diode and the p-n diode are connected in parallel with a dielectric isolation layer interposed therebetween. The dielectric isolation layer may comprise one of $SiO_2$, $Si_2N_3$, $HfO_2$, $ZrO_2$, or $Al_2O_3$.

According to an embodiment, the n-p diode comprises a first lower conductive electrode, a first n-type doped semiconductor layer, a first p-type doped semiconductor layer, and a first upper conductive electrode that are stacked sequentially from bottom to top, and the p-n diode comprises a second lower conductive electrode, a second p-type doped semiconductor layer, a second n-type doped semiconductor layer, and a second upper conductive electrode that are stacked sequentially from bottom to top.

According to an embodiment, the first lower conductive electrode and the second lower conductive electrode each comprise a metallic material or a conductive metallic compound. Materials for the first lower conductive electrode and the second lower conductive electrode may be the same or different. The metallic material comprises at least one selected from a group consisting of W, Al, Cu, Au, Ag, Pt, Ru, Ti, Ta, Pb, Co, Mo, Ir, and Ni, and the conductive metallic compound comprises at least one selected from a group consisting of TiN, TaN, $IrO_2$, ITO, and IZO.

According to an embodiment, the first lower conductive electrode and the second lower conductive electrode each are prepared by any of electron beam evaporation, chemical vapor deposition, pulsed laser deposition, atom layer deposition, or magnetron sputtering.

According to an embodiment, the first lower conductive electrode and the second lower conductive electrode each have a thickness of 1 nm-500 nm.

According to an embodiment, the first n-type doped semiconductor layer and the first p-type doped semiconductor layer form an n-p junction, which comprises a semiconductor material of Si, Ge, GaAs, InP, or SiGe modified by doping, and the second p-type doped semiconductor layer and the second n-type doped semiconductor layer form a p-n junction, which comprises a semiconductor material of Si, Ge, GaAs, InP, or SiGe modified by doping. The doping may be done by thermal diffusion or ion implantation, at a doping concentration of $1 \times 10^{12}$ cm$^{-2}$-$1 \times 10^{22}$ cm$^{-2}$. The gating device cell may have a positive ON voltage controlled by a doping concentration or a junction depth of the n-p junction in the n-p diode and a negative ON voltage controlled by a doping concentration or a junction depth of the p-n junction in the p-n diode.

According to an embodiment, the first n-type doped semiconductor layer, the first p-type doped semiconductor layer, the second p-type doped semiconductor layer, and the second n-type doped semiconductor layer each are prepared by any of chemical vapor deposition, atom layer deposition, and molecular beam epitaxy.

According to an embodiment, the first n-type doped semiconductor layer, the first p-type doped semiconductor layer, the second p-type doped semiconductor layer, and the second n-type doped semiconductor layer each have a thickness of 10 nm-500 nm.

According to an embodiment, the first upper conductive electrode and the second upper conductive electrode each comprise a metallic material or a conductive metallic compound. Materials for the first upper conductive electrode and the second upper conductive electrode may be the same or different. The metallic material comprises at least one selected from a group consisting of W, Al, Cu, Au, Ag, Pt, Ru, Ti, Ta, Pb, Co, Mo, Ir, and Ni, and the conductive metallic compound comprises at least one selected from a group consisting of TiN, TaN, IrO$_2$, ITO, and IZO.

According to an embodiment, the first upper conductive electrode and the second upper conductive electrode each are prepared by any of electron beam evaporation, chemical vapor deposition, pulsed laser deposition, atom layer deposition, or magnetron sputtering.

According to an embodiment, the first upper conductive electrode and the second upper conductive electrode each have a thickness of 1 nm-500 nm.

Advantageous Effects

As can be seen from the above technical solutions, the present disclosure has following advantageous effects.

The gating device cell for a cross array of bipolar resistive memory cells disclosed herein is formed by connecting a diode of the n-p type semiconductor material which can turn ON in the positive direction and a diode of the p-n type semiconductor material which can turn ON in the negative direction in parallel. The n-p diode turns ON under a positive voltage and turns OFF under a negative voltage; and the p-n diode turns on under a negative voltage and turns OFF under a positive voltage. When the n-p diode and the p-n diode are connected in parallel, a relatively great ON current and a relatively great non-linear resistance coefficient can be provided in both of the positive and negative voltage directions, thereby effectively suppressing the misreading phenomenon caused by read crosstalk in the cross array of bipolar resistive memory cells.

Further, the gating device cell for a cross array of bipolar resistive memory cells disclosed herein is formed by connecting two rectifier diodes of opposite polarities in parallel. Its structure is shown in FIG. 3. It may serve as a gating diode for the bipolar resistive memory, and can provide a relatively great ON current and a relatively great non-linear resistance coefficient in both of the positive and negative voltage directions, while maintaining a relatively good bidirectional rectification feature. That is, a relatively high current density can be provided in any voltage polarity when in the ON state. Further, it is possible to provide a relatively great rectification ratio ($R_{V/2}/R_V$) under a read voltage. Therefore, it is possible to suppress the read-crosstalk phenomenon in the cross array of bipolar resistive memory cells to avoid misreading, thereby solving the problem that a conventional rectifier diode is only applicable to a cross array of unipolar resistive memory cells.

BRIEF DESCRIPTION OF THE DRAWINGS

To further illustrate the concept of the present disclosure, a detailed description of the present disclosure will be given with reference to the drawings and embodiments, in which.

DETAILED DESCRIPTION

To make objects, solutions, and advantages of the present disclosure apparent, detailed description will be given in conjunction with specific embodiments with reference to the drawings.

Figure 1:
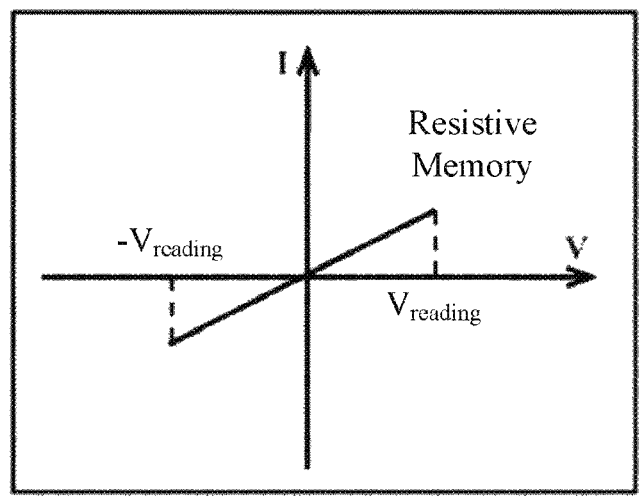
FIG. 1 is a current-voltage curve for a read operation of a resistive memory cell in a low resistance state in the prior art.
Figure 2:
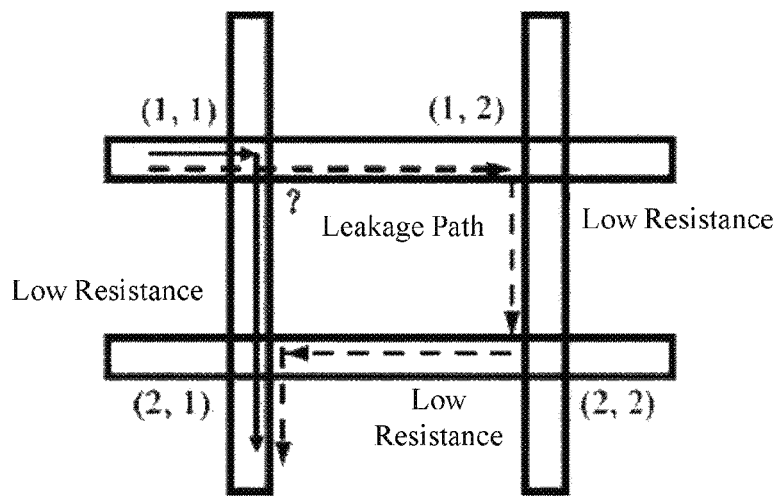
FIG. 2 is a diagram showing a read crosstalk problem in a cross array of resistive memory cells in the prior art.
Figure 3:
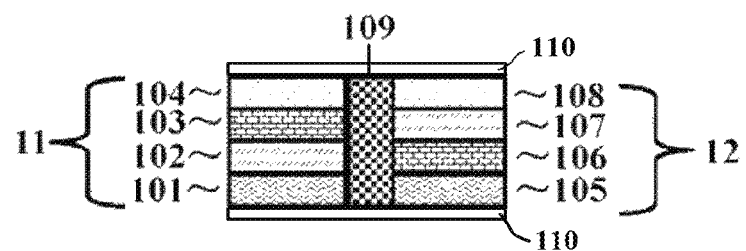
FIG. 3 is a structural diagram showing a gating device cell for a cross array of resistive memory cells according to an embodiment of the present disclosure, wherein 11 denotes an n-p diode, 12 denotes a p-n diode, 101 denotes a lower conductive electrode, 102 denotes an n-type semiconductor layer, 103 denotes a p-type semiconductor layer, 104 denotes an upper conductive electrode, 105 denotes a lower conductive electrode, 106 denotes a p-type semiconductor layer, 107 denotes an n-type semiconductor layer, 108 denotes an upper conductive electrode, and 109 denotes an isolation dielectric layer.

FIG. 3 is a structural diagram showing a gating device cell for a cross array of bipolar resistive memory cells according to an embodiment of the present disclosure. As shown in FIG. 3, this gating device cell comprises an n-p diode 11 and a p-n diode 12. The n-p diode 11 and the p-n diode 12 have opposite polarities and are connected in parallel, such that this gating device cell exhibits a bidirectional rectification feature.

The n-p diode 11 and the p-n diode 12 are connected in parallel by conductive layers 110, with a dielectric isolation layer 109 interposed therebetween. The dielectric isolation layer 109 may comprise any one of SiO2, ShN3, Hf02, Zr02, or Al203.

The n-p diode 11 comprises a first lower conductive electrode 101, a first n-type doped semiconductor layer 102, a first p-type doped semiconductor layer 103, and a first upper conductive electrode 104 that are stacked sequentially from bottom to top, and the p-n diode 12 comprises a second lower conductive electrode 105, a second p-type doped semiconductor layer 106, a second n-type doped semiconductor layer 107, and a second upper conductive electrode 108 that are stacked sequentially from bottom to top.

The first lower conductive electrode 101 and the second lower conductive electrode 105 each may comprise a metallic material or a conductive metallic compound. The first lower conductive electrode 101 and the second lower conductive electrode 105 may comprise the same material or different materials. The metallic material may comprise at least one selected from a group consisting of W, Al, Cu, Au, Ag, Pt, Ru, Ti, Ta, Pb, Co, Mo, Ir, and Ni, and the conductive metallic compound may comprise at least one selected from a group consisting of TiN, TaN, $IrO_2$, ITO, and IZO.

The first lower conductive electrode 101 and the second lower conductive electrode 105 each may be prepared by any one of electron beam evaporation, chemical vapor deposition, pulsed laser deposition, atom layer deposition, or magnetron sputtering. The first lower conductive electrode 101 and the second lower conductive electrode 105 each may have a thickness of 1 nm-500 nm.

The first n-type doped semiconductor layer 102 and the first p-type doped semiconductor layer 103 form an n-p junction, which may comprise a semiconductor material, such as Si, Ge, GaAs, InP, or SiGe, modified by doping. The second p-type doped semiconductor layer 106 and the second n-type doped semiconductor layer 107 form a p-n junction, which may comprise a semiconductor material, such as Si, Ge, GaAs, InP, or SiGe, modified by doping. The doping can be done by thermal diffusion or ion implantation, at a doping concentration of $1\times10^{12}$ cm$^{-2}$-$1\times10^{22}$ cm$^{-2}$. The gating device cell may have a positive ON voltage controlled by the doping concentration or a junction depth of the n-p junction in the n-p diode and a negative ON voltage controlled by the doping concentration or a junction depth of the p-n junction of the p-n diode.

The first n-type doped semiconductor layer 102, the first p-type doped semiconductor layer 103, the second p-type doped semiconductor layer 106, and the second n-type doped semiconductor layer 107 each may be prepared by any one of chemical vapor deposition, atom layer deposition, or molecular beam epitaxy. The first n-type doped semiconductor layer 102, the first p-type doped semiconductor layer 103, the second p-type doped semiconductor layer 106, and the second n-type doped semiconductor layer 107 each may have a thickness of 10 nm-500 nm.

The first upper conductive electrode 104 and the second upper conductive electrode 108 each may comprise a metallic material or a conductive metallic compound. The first upper conductive electrode 104 and the second upper conductive electrode 108 may comprise the same material or different materials. The metallic material may comprise at least one selected from a group consisting of W, Al, Cu, Au, Ag, Pt, Ru, Ti, Ta, Pb, Co, Mo, Ir, and Ni, and the conductive metallic compound may comprise at least one selected from a group consisting of TiN, TaN, $IrO_2$, ITO, and IZO.

The first upper conductive electrode 104 and the second upper conductive electrode 108 each may be prepared by any one of electron beam evaporation, chemical vapor deposition, pulsed laser deposition, atom layer deposition, or magnetron sputtering. The first upper conductive electrode 104 and the second upper conductive electrode 108 each may have a thickness of 1 nm-500 nm.

According to the embodiment of the present disclosure, the gating device cell is formed by connecting the n-p diode and the p-n diode in parallel. This gating device cell may have an effect of suppressing the read crosstalk in the cross array of bipolar resistive memory cells.

Figure 4:
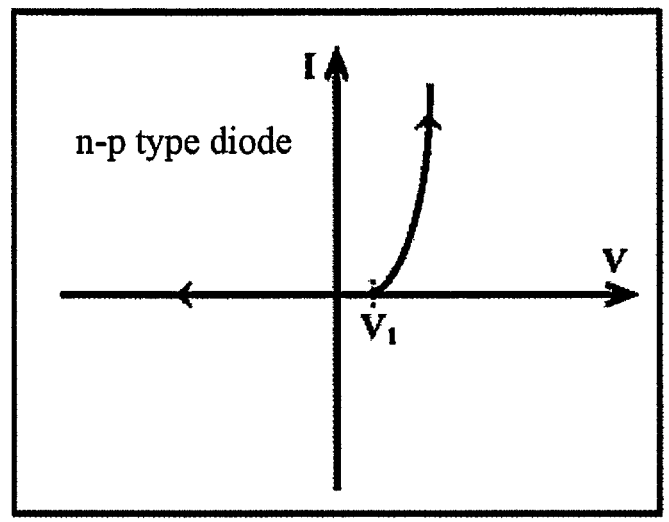
FIG. 4 is a current-voltage characteristic curve of an n-p junction diode included in a gating device cell in a DC scanning mode according to an embodiment of the present disclosure.

FIG. 4 is a current-voltage characteristic curve of an n-p junction diode included in a gating device cell in a DC scanning mode according to an embodiment of the present disclosure. When the positive scanning voltage exceeds $V_1$, the n-p diode turns ON in the positive direction, and thus is in a low resistance state; while under the negative scanning voltage, the n-p diode is in an OFF state and thus in a high resistance state.

Figure 5:
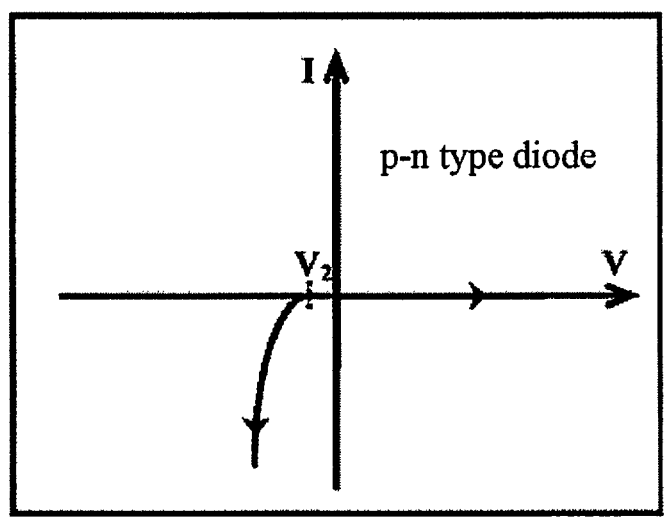
FIG. 5 is a current-voltage characteristic curve of a p-n junction diode included in a gating device cell in a DC scanning mode according to an embodiment of the present disclosure.

FIG. 5 is a current-voltage characteristic curve of a p-n junction diode included in a gating device cell in a DC scanning mode according to an embodiment of the present disclosure. The characteristic of the p-n diode is opposite to that of the n-p diode. When the negative scanning voltage exceeds $V_2$ in absolute value, the p-n diode turns ON in the negative direction, and thus is in a low resistance state; while under the positive scanning voltage, the p-n diode is in an OFF state and thus in a high resistance state.

Figure 6:
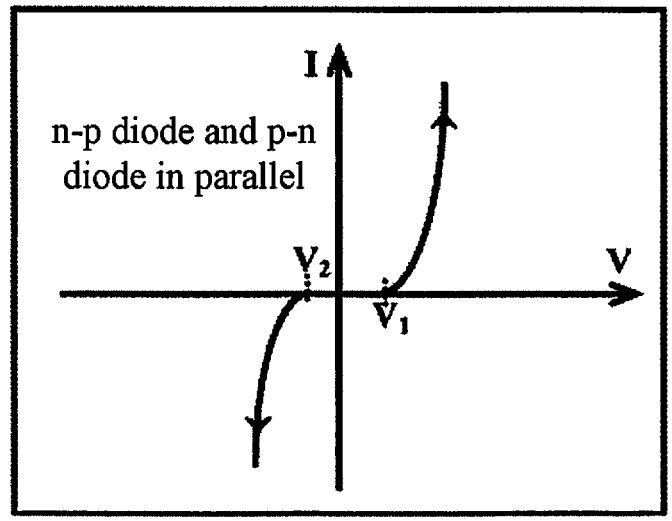
FIG. 6 is a current-voltage characteristic curve of an n-p junction diode and a p-n junction diode, which are connected in parallel, in a gating device cell in a DC scanning mode according to an embodiment of the present disclosure.
Figure 7:
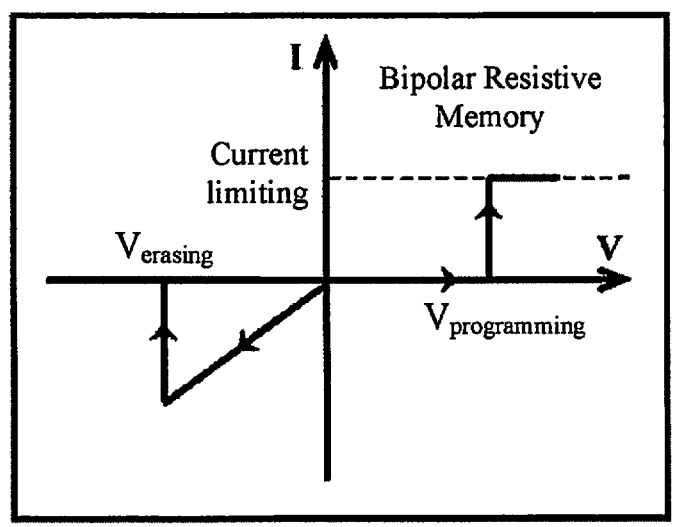
FIG. 7 is a current-voltage characteristic curve of a bipolar resistive memory cell in a DC scanning mode according to an embodiment of the present disclosure.

FIG. 6 is a current-voltage characteristic curve of an n-p junction diode and a p-n junction diode, which are connected in parallel, in a gating device cell in a DC scanning mode according to an embodiment of the present disclosure. When the positive scanning voltage exceeds $V_1$, the n-p diode turns ON, that is, the gating device turns ON; while when the negative scanning voltage exceeds $V_2$ in absolute value, the p-n diode turns ON such that the gating device turns ON. As can be seen from FIG. 6, the gating device formed by connecting the n-p diode and the p-n diode in parallel can provide a relatively great current in both of the positive and negative voltage directions. Therefore, the current requirements in both the positive and negative voltage polarities for programming/erasing operations of the bipolar resistive memory as shown in FIG. 7 can be met.

In addition, when the voltage across the gating device formed by connecting the n-p diode and the p-n diode in parallel is less than the ON voltage $V_1$ (or $V_2$), the gating device is in a relatively high resistance state. Therefore, in a cross array of cells, each of which is formed by the gating device cell of the n-p diode and the p-n diode in parallel and the bipolar resistive memory cell, an arrangement for applying a voltage of V/2 is used, as shown in FIG. 8.

A $(\frac{1}{2})V_{programming}$ or $(\frac{1}{2})V_{reading}$ voltage is applied to a word line at which a cell to be selected is located, a $(-\frac{1}{2})V_{programming}$ or $(-\frac{1}{2})V_{reading}$ voltage is applied to a bit line at which the cell to be selected is located, and a zero bias voltage is applied to other word lines and bit lines. At this point, the voltage across the selected cell is $V_{programming}$ or $V_{reading}$, and the voltage across the memory cells on the same word line or the same bit line as the selected cell is $(\pm\frac{1}{2})V_{programming}$ or $(\pm\frac{1}{2})V_{reading}$, while the voltage across the remaining memory cells is zero. Therefore, with such a voltage pattern, the read crosstalk in the array is mainly originated from the memory cell(s) which is (are) in the low resistance state on the same bit line or the same word line.

Figure 8:
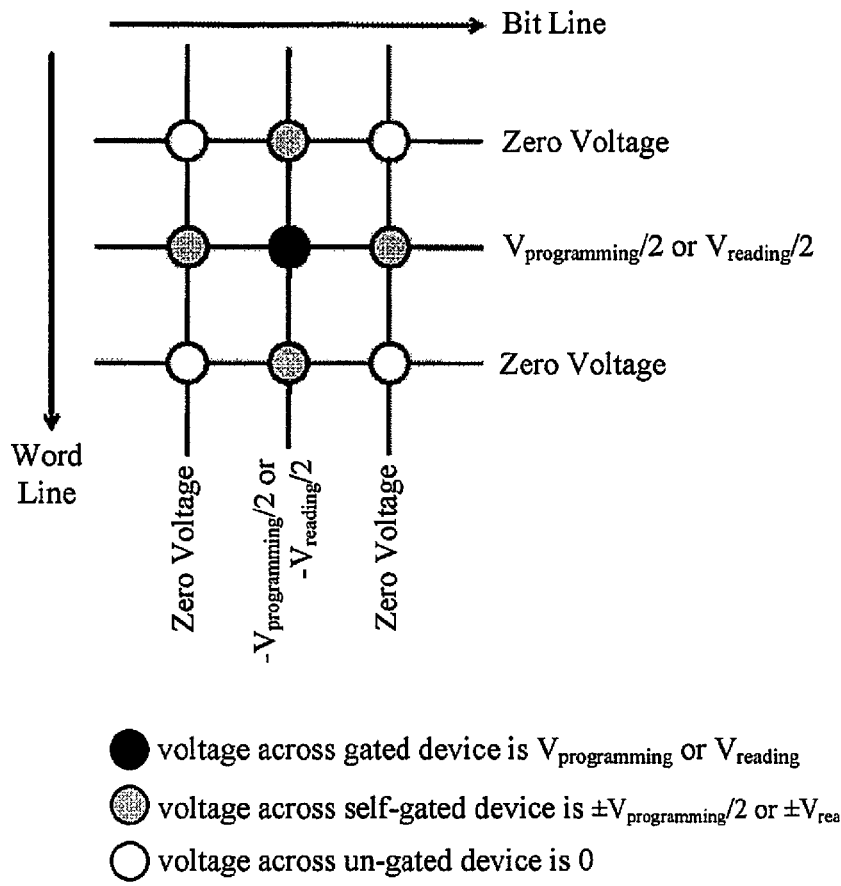
FIG. 8 is a diagram showing an arrangement for applying a read/write voltage of V/2 to a cross array of cells, each of which is formed by connecting a bipolar resistive memory cell and a gating device in series, according to an embodiment of the present disclosure.
Figure 9:
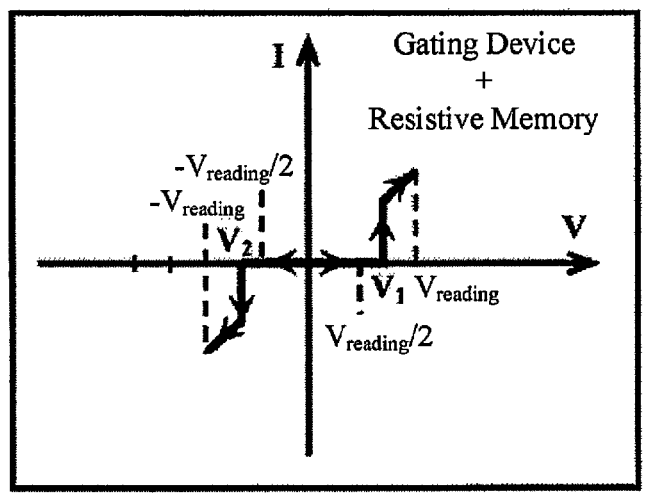
FIG. 9 is a read current-voltage characteristic curve of a bipolar resistive memory cell connected in series with a gating device in a DC scanning mode according to an embodiment of the present disclosure.

As can be seen from FIG. 8, when the selected memory cell is being read, the voltage across a memory cell on the same bit line or the same word line as the selected memory cell is $(\pm\frac{1}{2})V_{reading}$. In an embodiment of the present disclosure, the applied read voltage satisfies that $V_{reading}/2<V_1<V_{reading}$ and $|-V_{reading}/2|<|V_2|<|-V_{reading}|$. The memory cell formed by connecting the gating device and the bipolar memory cell in series exhibits a bidirectional rectification feature during the read operation, as shown in FIG. 9.

Under the voltage $\pm V_{reading}$, the memory cell exhibits a resistance of the resistive memory cell, and the gating device is in a low resistance state; while under the voltage $(\pm\frac{1}{2})V_{reading}$, the memory cell exhibits a resistance of the diode in the OFF state and therefore in a high resistance state, thereby reducing the leakage paths generated by the memory cells on the same bit line or the same word line. The present disclosure defines the rectification as $R_{V/2}/R_V$. The effect of suppressing the read crosstalk in the cross array of bipolar resistive memory cells by the gating device proposed by the present disclosure is determined mainly by the rectification ratio ($R_{V/2}/R_V$).

The above specific embodiments provide detailed explanations of the objects, technical solutions, and advantageous effects of the present disclosure. It is to be understood that the above descriptions are only illustrative, and the present disclosure is not limited thereto. Any modification, equivalent substitution, or improvement made within the spirit and principle of the present disclosure shall fall into the scope of the present disclosure.

We claim:

1. A gating device cell for a cross array of bipolar resistive memory cells, comprising an n-p diode and a p-n diode, wherein the n-p diode and the p-n diode have opposite polarities and are connected in parallel, such that the gating device cell exhibits a bidirectional rectification feature.

2. The gating device cell according to claim 1, wherein the n-p diode and the p-n diode are connected in parallel with a dielectric isolation layer interposed therebetween.

3. The gating device cell according to claim 2, wherein the dielectric isolation layer comprises one of $SiO_2$, $Si_2N_3$, $HfO_2$, $ZrO_2$, or $Al_2O_3$.

4. The gating device cell according to claim 1, wherein the n-p diode comprises a first lower conductive electrode, a first n-type doped semiconductor layer, a first p-type doped semiconductor layer, and a first upper conductive electrode that are stacked sequentially from bottom to top, and the p-n diode comprises a second lower conductive electrode, a second p-type doped semiconductor layer, a second n-type doped semiconductor layer, and a second upper conductive electrode that are stacked sequentially from bottom to top.

5. The gating device cell according to claim 4, wherein the first lower conductive electrode and the second lower conductive electrode each comprise a metallic material or a conductive metallic compound, and materials for the first lower conductive electrode and the second lower conductive electrode are the same or different.

6. The gating device cell according to claim 5, wherein the metallic material comprises at least one selected from a group consisting of W, Al, Cu, Au, Ag, Pt, Ru, Ti, Ta, Pb, Co, Mo, Ir, and Ni, and the conductive metallic compound comprises at least one selected from a group consisting of TiN, TaN, $IrO_2$, ITO, and IZO.

7. The gating device cell according to claim 4, wherein the first lower conductive electrode and the second lower conductive electrode each are prepared by any of electron beam evaporation, chemical vapor deposition, pulsed laser deposition, atom layer deposition, or magnetron sputtering.

8. The gating device cell according to claim 4, wherein the first lower conductive electrode and the second lower conductive electrode each have a thickness of 1 nm-500 nm.

9. The gating device cell according to claim 4, wherein the first n-type doped semiconductor layer and the first p-type doped semiconductor layer form an n-p junction, which comprises a semiconductor material of Si, Ge, GaAs, InP, or SiGe modified by doping, and the second p-type doped semiconductor layer and the second n-type doped semiconductor layer form a p-n junction, which comprises a semiconductor material of Si, Ge, GaAs, InP, or SiGe modified by doping.

10. The gating device cell according to claim 9, wherein the doping is done by thermal diffusion or ion implantation, at a doping concentration of $1\times10^{12}$ $cm^{-2}$-$1\times10^{22}$ $cm^{-2}$.

11. The gating device cell according to claim 9, wherein the gating device cell has a positive ON voltage controlled by a doping concentration or a junction depth of the n-p junction in the n-p diode and a negative ON voltage controlled by a doping concentration or a junction depth of the p-n junction in the p-n diode.

12. The gating device cell according to claim 4, wherein the first n-type doped semiconductor layer, the first p-type doped semiconductor layer, the second p-type doped semiconductor layer, and the second n-type doped semiconductor layer each are prepared by any of chemical vapor deposition, atom layer deposition, and molecular beam epitaxy.

13. The gating device cell according to claim 4, wherein the first n-type doped semiconductor layer, the first p-type doped semiconductor layer, the second p-type doped semiconductor layer, and the second n-type doped semiconductor layer each have a thickness of 10 nm-500 nm.

14. The gating device cell according to claim 4, wherein the first upper conductive electrode and the second upper conductive electrode each comprises a metallic material or a conductive metallic compound, and materials for the first upper conductive electrode and the second upper conductive electrode are the same or different.

15. The gating device cell according to claim 14, wherein the metallic material comprises at least one selected from a group consisting of W, Al, Cu, Au, Ag, Pt, Ru, Ti, Ta, Pb, Co, Mo, Ir, and Ni, and the conductive metallic compound comprises at least one selected from a group consisting of TiN, TaN, $IrO_2$, ITO, and IZO.

16. The gating device cell according to claim 4, wherein the first upper conductive electrode and the second upper conductive electrode each are prepared by any of electron beam evaporation, chemical vapor deposition, pulsed laser deposition, atom layer deposition, or magnetron sputtering.

17. The gating device cell according to claim 4, wherein the first upper conductive electrode and the second upper conductive electrode each have a thickness of 1 nm-500 nm.

* * * * *